(12) United States Patent
Nagase et al.

(10) Patent No.: US 8,705,269 B2
(45) Date of Patent: Apr. 22, 2014

(54) MAGNETORESISTIVE ELEMENT AND MAGNETIC MEMORY

(75) Inventors: Toshihiko Nagase, Yokohama (JP); Tadashi Kai, Tokyo (JP); Makoto Nagamine, Tokyo (JP); Katsuya Nishiyama, Yokohama (JP); Eiji Kitagawa, Yokohama (JP); Tadaomi Daibou, Yokohama (JP); Koji Ueda, Kamakura (JP); Hiroaki Yoda, Kawasaki (JP); Kay Yakushiji, Tsukuba (JP); Shinji Yuasa, Tsukuba (JP); Hitoshi Kubota, Tsukuba (JP); Taro Nagahama, Tsukuba (JP); Akio Fukushima, Tsukuba (JP); Koji Ando, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 13/232,782

(22) Filed: Sep. 14, 2011

(65) Prior Publication Data

US 2012/0069640 A1    Mar. 22, 2012

(30) Foreign Application Priority Data

Sep. 16, 2010  (JP) .................................. 2010-208042

(51) Int. Cl.
*G11C 11/16* (2006.01)
(52) U.S. Cl.
USPC ........................................................ 365/158
(58) Field of Classification Search
USPC .......................................................... 365/158
See application file for complete search history.

(56) References Cited

U.S. PATENT DOCUMENTS

| 7,663,197 B2 | 2/2010 | Nagase |
| 7,768,824 B2 | 8/2010 | Yoshikawa |

(Continued)

FOREIGN PATENT DOCUMENTS

JP    2009-081216    4/2009

OTHER PUBLICATIONS

U.S. Appl. No. 13/043,064, filed Mar. 8, 2011, Tadaomi Daibou.

(Continued)

*Primary Examiner* — Hoai V Ho
*Assistant Examiner* — Min Huang
(74) *Attorney, Agent, or Firm* — Knobbe, Martens, Olson & Bear, LLP

(57) ABSTRACT

A magnetoresistive element according to an embodiment includes: a first and second magnetic layers having an easy axis of magnetization in a direction perpendicular to a film plane; and a first nonmagnetic layer interposed between the first and second magnetic layers, at least one of the first and second magnetic layers including a structure formed by stacking a first and second magnetic films, the second magnetic film being located closer to the first nonmagnetic layer, the second magnetic film including a structure formed by repeating stacking of a magnetic material layer and a nonmagnetic material layer at least twice, the nonmagnetic material layers of the second magnetic film containing at least one element selected from the group consisting of Ta, W, Hf, Zr, Nb, Mo, Ti, V, and Cr, one of the first and second magnetic layers having a magnetization direction that is changed by applying a current.

18 Claims, 15 Drawing Sheets

1D

(56) References Cited

U.S. PATENT DOCUMENTS

| | | |
|---|---|---|
| 7,957,184 B2 | 6/2011 | Yoshikawa et al. |
| 2004/0213071 A1* | 10/2004 | Hiramoto et al. ............. 365/232 |
| 2009/0080238 A1 | 3/2009 | Yoshikawa et al. |
| 2009/0080239 A1* | 3/2009 | Nagase et al. ................ 365/158 |
| 2010/0080050 A1* | 4/2010 | Ozeki et al. ................... 365/158 |
| 2010/0230770 A1 | 9/2010 | Yoshikawa et al. |
| 2011/0211389 A1 | 9/2011 | Yoshikawa et al. |
| 2012/0243305 A1 | 9/2012 | Nakayama |

OTHER PUBLICATIONS

Ikeda, S. et al.; "A perpendicular-anisotropy CoFeB-MgO magnetic tunnel junction;" Jul. 2010; Nature Materials; pp. 1-4.

* cited by examiner

MAGNETORESISTIVE ELEMENT AND MAGNETIC MEMORY

CROSS-REFERENCE TO RELATED APPLICATION

This application is based upon and claims the benefit of priority from prior Japanese Patent Application No. 2010-208042 filed on Sep. 16, 2010 in Japan, the entire contents of which are incorporated herein by reference.

FIELD

Embodiments described herein relate generally to a magnetoresistive element and a magnetic memory.

BACKGROUND

In recent years, magnetic random access memories (hereinafter referred to as MRAMs) using the magnetoresistive effect of ferromagnetic materials have been drawing increasing attention as the next-generation solid-state nonvolatile memories that can cope with high-speed reading and writing, large capacities, and low-power-consumption operations. Particularly, there has been increasing interest in magnetoresistive elements having ferromagnetic tunnel junctions since the high rate of change in magnetoresistance of such magnetoresistive elements was discovered. A ferromagnetic tunnel junction has a three-layer stack structure formed by stacking a recording layer having a changeable magnetization direction, an insulator layer, and a fixed layer that is located on the opposite side from the recording layer and maintains a predetermined magnetization direction.

Magnetoresistive elements having such ferromagnetic tunnel junctions are also called MTJs (Magnetic Tunnel Junctions). As a write method to be used in such magnetoresistive elements, there has been suggested a write method (spin torque transfer switching technique) using spin momentum transfers (SMTs). According to this method, the magnetization direction of a recording layer is reversed by applying a spin-polarized current to the magnetoresistive element. Furthermore, as the volume of the magnetic layer forming the recording layer is smaller, the spin-polarized electrons to be injected can be fewer. Accordingly, this method is expected to be a write method that can achieve both device miniaturization and lower currents.

As the ferromagnetic materials forming such a magnetoresistive element, so-called perpendicular magnetization films each having an easy axis of magnetization in a direction perpendicular to the film plane have been considered. In a case where a magnetic crystalline anisotropy is used in a structure of a perpendicular magnetization type, shape anisotropies are not used, and accordingly, the device shape can be made smaller than that of an in-plane magnetization type. Also, variance in the easy axis of magnetization can be made smaller. Accordingly, by using a material having a large magnetic crystalline anisotropy, both miniaturization and lower currents can be expected to be achieved while a thermal disturbance resistance is maintained.

Where a MTJ is formed as a device of a perpendicular magnetization type, the materials of the recording layer and the base layer for adjusting the crystalline orientation are diffused due to a heat treatment, and the MR ratio becomes lower. To counter this problem, there has been a known technique for achieving a high MR ratio by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other (JP-A 2009-081216 (KOKAI), for example). By using this technique, a high MR ratio can be achieved. However, with the heat treatment in the device manufacturing process being taken into consideration, the MR ratio and the resistance ratio preferably do not change when a heat treatment is further performed after the initial state.

DETAILED DESCRIPTION

Figure 1:
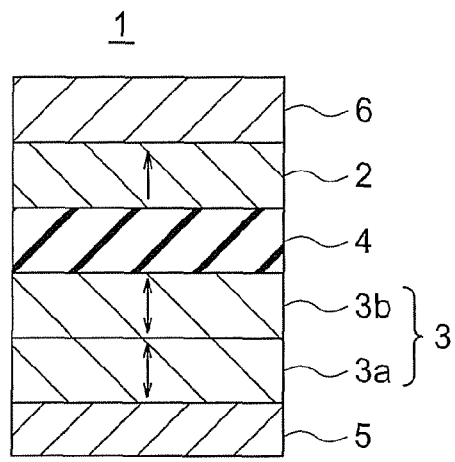
FIG. 1 is a cross-sectional view showing a magnetoresistive element according to a first embodiment.

A magnetoresistive element according to an embodiment includes: a first magnetic layer having an easy axis of magnetization in a direction perpendicular to a film plane; a second magnetic layer having an easy axis of magnetization in a direction perpendicular to the film plane; and a first nonmagnetic layer interposed between the first magnetic layer and the second magnetic layer. At least one of the first magnetic layer and the second magnetic layer includes a structure formed by stacking a first magnetic film and a second magnetic film, the second magnetic film being located closer to the first nonmagnetic layer than the first magnetic film, the second magnetic film includes a structure formed by repeating stacking of a magnetic material layer and a nonmagnetic material layer at least twice, the nonmagnetic material layers of the second magnetic film contain at least one element selected from the group consisting of Ta, W, Hf, Zr, Nb, Mo, Ti, V, and Cr, and one of the first magnetic layer and the second magnetic layer has a magnetization direction that is changed by applying a current between the first magnetic layer and the second magnetic layer via the first nonmagnetic layer.

The following is a description of the basic concept of magnetoresistive elements according to embodiments.

In the following description, components having like functions and like structures are denoted by like reference numerals, and explanation of them is repeated only where necessary. It should be noted that the accompanying drawings are merely schematic, and the relationship between thickness and planar size, the ratios among respective layers, and the like differ from those of actual devices. Therefore, specific thicknesses and sizes should be calculated by taking into account the following description. Also, the size relationships and ratios of course vary among the drawings.

(First Embodiment)

FIG. 1 shows a magnetoresistive element of a first embodiment. FIG. 1 is a cross-sectional view of the magnetoresistive element 1 of the first embodiment. In FIG. 1, the arrows indicate magnetization directions. In this specification and the claims, a magnetoresistive element is a TMR (tunneling magnetoresistive effect) device that has a semiconductor or an insulator as a spacer layer. The drawings to be referred to hereafter show relevant components of magnetoresistive elements. However, each magnetoresistive element can include more layers, as long as each magnetoresistive element includes the components shown in each corresponding drawing.

Writing in the magnetoresistive element 1 is performed by using a spin torque transfer switching technique. That is, the relative angle between the magnetizations of the recording layer and the fixed layer is switched between parallel and antiparallel (the minimum and the maximum in resistance), depending on the direction of the spin-polarized current applied to the recording layer in a direction perpendicular to the film plane. The relative angle is associated with binary information "0" or "1", and the information is then stored.

As shown in FIG. 1, the magnetoresistive element 1 at least includes two magnetic layers 2 and 3, and a nonmagnetic layer 4 interposed between the magnetic layer 2 and the magnetic layer 3. The magnetic layer 3 is provided on a base layer 5, and has an easy axis of magnetization in a direction perpendicular to the film plane. The magnetization of the magnetic layer 3 rotates in a plane perpendicular to the film plane. That is, the magnetization direction of the magnetic layer 3 is changeable. Here, a changeable magnetization direction means that the magnetization direction differs before and after writing. In this specification, a film plane is the upper face of a subject layer. Hereinafter, the magnetic layer 3 will be referred to as the recording layer (the free layer, the free magnetization layer, the changeable magnetization layer, or the recording layer). The recording layer 3 of this embodiment is a structure formed by stacking a magnetic film 3a and a magnetic film 3b. The characteristics of the recording layer 3 will be described later in detail. Hereinafter, a magnetization perpendicular to a film plane will be referred to as a perpendicular magnetization. Since the magnetic film 3b is in contact with the nonmagnetic layer 4, the magnetic film 3b has the effect to reduce the lattice mismatch in the interface. Also, by using a material having a high spin polarizability, a high TMR and a high spin-injection efficiency can be realized.

The magnetic layer 2 has an easy axis of magnetization in a direction perpendicular to the film plane, and has a fixed magnetization direction with respect to the recording layer. Here, a fixed magnetization direction means that the magnetization direction does not differ before and after writing. Hereinafter, the magnetic layer 2 will be referred to as the fixed layer (the fixed magnetization layer, the reference layer, the reference magnetization layer, a pinned layer, a base layer, or a base magnetization layer). The characteristics of the fixed layer 2 will be described later in detail. In the typical example shown in FIG. 1, the magnetization direction of the fixed layer 2 is the direction away from the substrate (not shown) provided under the base layer 5, or is the upward direction. However, the magnetization direction of the fixed layer 2 can be the direction toward the substrate, or can be the downward direction.

The nonmagnetic layer 4 is also called a tunnel barrier layer, and includes an insulating film made of an oxide or the like. The characteristics of the nonmagnetic layer 4 will be described later in detail.

The magnetoresistive element 1 of this embodiment is a magnetoresistive element to be used for spin torque transfer switching technique. That is, when writing is performed, a current flowing in a direction perpendicular to the film plane is applied from the fixed layer 2 to the recording layer 3, or form the recording layer 3 to the fixed layer 2, so that the electrons having spin information are injected from the fixed layer 2 into the recording layer 3. As the spin angular momentum of the injected electrons is transferred to the electrons in the recording layer 3 under the principle of conservation of spin angular momentum, the magnetization of the recording layer 3 is reversed. For example, in a case where the magnetization direction of the recording layer 3 is antiparallel to the magnetization direction of the fixed layer 2, a current is applied from the recording layer 3 to the fixed layer 2. In that case, electrons flow from the fixed layer 2 to the recording layer 3. At that point, the electrons spin-polarized by the fixed layer 2 flow into the recording layer 3 through the nonmagnetic layer 4, and the spin angular momentum is transferred to the recording layer 3. The magnetization direction of the recording layer 3 is then reversed, to become parallel to the magnetization direction of the fixed layer 2. In a case where the magnetization direction of the fixed layer 2 is parallel to the magnetization direction of the recording layer 3, on the other hand, a current is applied from the fixed layer 2 to the recording layer 3. In that case, electrons flow from the recording layer 3 to the fixed layer 2. At that point, the electrons spin-polarized by the recording layer 3 flow into the fixed layer 2 through the nonmagnetic layer 4. The electrons having spins in the same direction as the magnetization direction of the fixed layer 2 pass through the fixed layer 2, but the electrons having spins in the opposite direction from the magnetization direction of the fixed layer 2 are reflected by the interface between the nonmagnetic layer 4 and the fixed layer 2, and flow into the recording layer through the nonmagnetic layer 4. The spin angular momentum is then transferred to the recording layer 3, and the magnetization direction of the recording layer 3 is reversed, to become antiparallel to the magnetization direction of the fixed layer 2. It should be noted that, when information is read from the magnetoresistive element 1, a read current that does not reverse the magnetization of the recording layer 3 is applied between the recording layer 3 and the fixed layer 2 through the nonmagnetic layer 4. In this manner, information reading can be performed.

In the magnetoresistive element 1 of the first embodiment shown in FIG. 1, the recording layer 3 is formed on the base layer 5, and the fixed layer 2 is formed on the nonmagnetic layer 4. This structure is a so-called top-pin structure. The base layer 5 is used to control the crystalline characteristics such as the crystalline orientations and the grain sizes of the layers located above the recording layer 3, and the characteristics of the base layer 5 will be described later in detail. A cap layer 6 can be further formed on the fixed layer 2. The cap layer 6 functions mainly as a protection layer to prevent oxidation of the magnetic layers.

(Second Embodiment)

Figure 2:
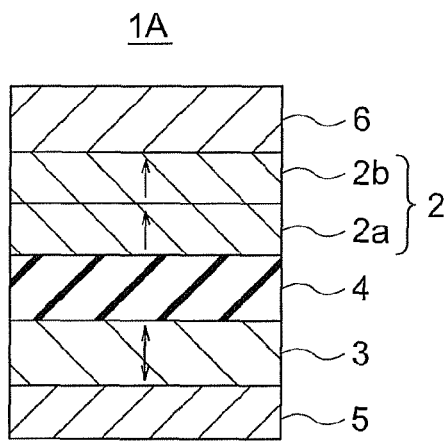
FIG. 2 is a cross-sectional view showing a magnetoresistive element according to a second embodiment.

FIG. 2 is a cross-sectional view of a magnetoresistive element of a second embodiment. The magnetoresistive element 1A of the second embodiment is the same as the magnetoresistive element 1 of the first embodiment shown in FIG. 1, except that the recording layer 3 is a single layer, instead of a stack structure, and the fixed layer 2 is a stack structure formed by stacking a magnetic film 2a and magnetic film 2b. Since the magnetic film 2a is in contact with the nonmagnetic layer 4, the magnetic film 2a has the effect to reduce the lattice mismatch in the interface. Also, by using a material having a high spin polarizability, a high TMR and a high spin-injection efficiency can be realized. The characteristics of the magnetic film 2a and the magnetic film 2b will be described later in detail.

(Third Embodiment)

Figure 3:
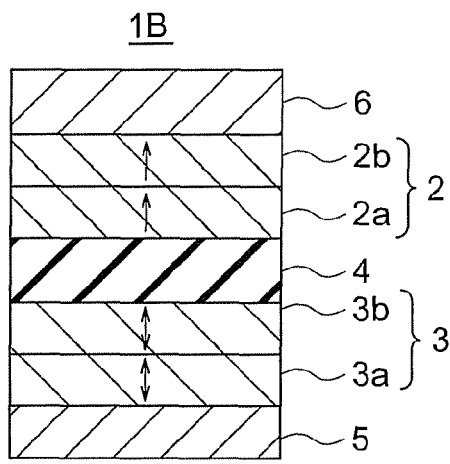
FIG. 3 is a cross-sectional view showing a magnetoresistive element according to a third embodiment.

FIG. 3 is a cross-sectional view of a magnetoresistive element according to a third embodiment. The magnetoresistive element 1B of the third embodiment is the same as the magnetoresistive element 1 of the first embodiment shown in FIG. 1, except that the fixed layer 2 is a stack structure formed by stacking a magnetic film 2a and a magnetic film 2b.

Since the magnetic film 2a is in contact with the nonmagnetic layer 4, the magnetic film 2a has the effect to reduce the lattice mismatch in the interface. Also, by using a material having a high spin polarizability, a high TMR and a high spin-injection efficiency can be realized.

(Fourth Embodiment)

Figure 4:
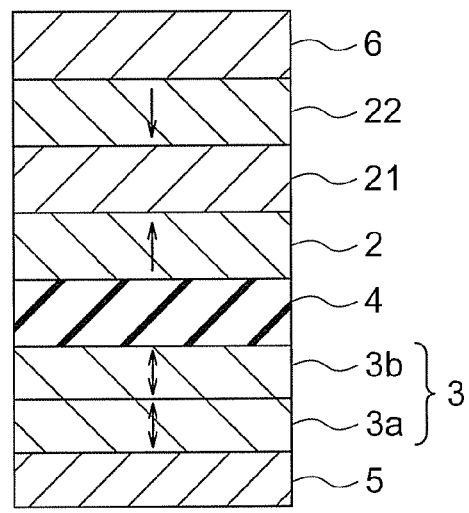
FIG. 4 is a cross-sectional view showing a magnetoresistive element according to a fourth embodiment.

FIG. 4 is a cross-sectional view of a magnetoresistive element according to a fourth embodiment. The magnetoresistive element 1C of the fourth embodiment is the same as the magnetoresistive element 1 of the first embodiment shown in FIG. 1, except that a nonmagnetic layer 21 and a bias layer (a shift adjustment layer) 22 are inserted between the fixed layer 2 and the cap layer 6.

The bias layer 22 is made of a ferromagnetic material, and is a perpendicular magnetization film having an easy axis of magnetization in a direction perpendicular to the film plane. The magnetization of the bias layer 22 is fixed in the opposite direction from (or in the direction antiparallel to) the magnetization direction of the fixed layer 2. The bias layer 22 has the effect to adjust the offset of the recording layer switching properties in the opposite direction. The offset of the recording layer switching properties is caused due to a leak field from the fixed layer 2, which is the problem in the device processing. The characteristics of the nonmagnetic layer 21 and the bias layer 22 will be described later in detail.

(Fifth Embodiment)

Figure 5:
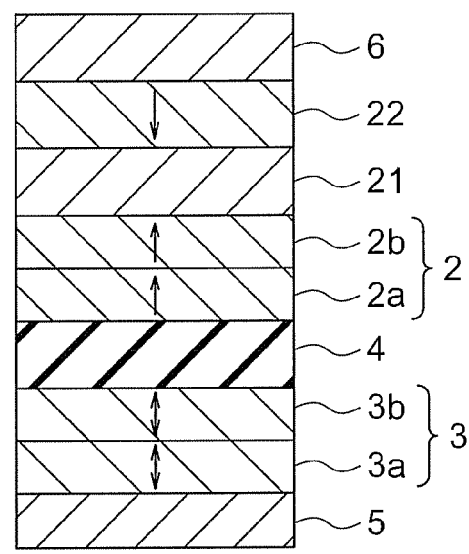
FIG. 5 is a cross-sectional view showing a magnetoresistive element according to a fifth embodiment.

FIG. 5 is a cross-sectional view of a magnetoresistive element according to a fifth embodiment. The magnetoresistive element 1D of the fifth embodiment is the same as the magnetoresistive element 1B of the third embodiment shown in FIG. 3, except that the nonmagnetic layer 21 and the bias layer (the shift adjustment layer) 22 are inserted between the fixed layer 2 and the cap layer 6.

In each of the above described first through fifth embodiments, the recording layer 3 is formed on the base layer 5, and the fixed layer 2 is formed on the nonmagnetic layer 4. Such a structure is a so-called top-pin structure. However, it is possible to form a bottom-pin structure in which the fixed layer 2 is formed on the base layer 5, and the recording layer 3 is formed on the nonmagnetic layer 4.

Next, the respective layers used in the first through fifth embodiments are described.

(Recording Layer)

First, the recording layer in each of the first through fifth embodiments is described. In a case where a perpendicular magnetization film is used as the recording layer 3, shape anisotropies are not used as described above. Accordingly, the device shape can be made smaller than that of a magnetoresistive element of an in-plane magnetization type. Also, by using a material having a high perpendicular magnetic anisotropy, miniaturization and a lower current can be both achieved while the resistance to thermal disturbance is maintained. In the following, the characteristics required in the recording layer, and specific examples of materials that can be selected are described in detail.

(Characteristics Required in Recording Layer)

In a case where a perpendicular magnetization material is used as the recording layer 3, the thermal disturbance index $\Delta$ is expressed as follows by calculating the ratio between the effective anisotropy energy ($K_u^{eff} \cdot V$) and the thermal energy ($k_B T$):

$$\Delta = K_u^{eff} \cdot V / (k_B T) \quad (1)$$
$$= (K_u - 2\pi N M_S^2) \cdot V_a / (k_B T)$$

where
$K_u^{eff}$: effective perpendicular magnetic anisotropy
V: volume of perpendicular magnetization material
T: temperature of perpendicular magnetization material
$k_B$: Boltzmann constant
$K_u$: perpendicular magnetic anisotropy
$M_S$: saturation magnetization
N: demagnetizing coefficient
$V_a$: magnetization switching unit volume.

To avoid the problem of magnetization fluctuations due to the thermal energy (thermal disturbance), the thermal disturbance index $\Delta$ preferably has a value larger than 60. However, if the device size and the film thicknesses are made smaller to achieve a larger capacity, the magnetization switching unit volume Va becomes smaller, and the stored information cannot be maintained (=thermal disturbance). As a result, the recording layer 3 becomes unstable. Therefore, for the recording layer 3, it is preferable to select a material having a high perpendicular magnetic anisotropy Ku and/or a small saturation magnetization MS.

Meanwhile, the critical current IC required for a magnetization switching through spin torque transfer switching technique of a perpendicular magnetization type is normally proportional to $\alpha/(\eta \cdot \Delta)$. Here, $\alpha$ represents the magnetic relaxation constant, and $\eta$ represents the spin-injection efficiency coefficient.

(Material of Recording Layer)

To realize a perpendicular magnetization film that can achieve both a high resistance to thermal disturbance and magnetization switchings with a low current, it is preferable to use a material that has a small saturation magnetization $M_S$, a magnetic anisotropy $K_u$ that is high enough to maintain the thermal disturbance index ($\Delta$), and a high polarizability. In the following, this aspect is described in greater detail.

The recording layer 3 is made of an alloy containing cobalt (Co) and palladium (Pd), or an alloy containing cobalt (Co) and platinum (Pt). A base layer having an oriented close-packed plane is appropriately selected as the base layer 5 shown in each of FIGS. 1 through 5. With this arrangement, the crystalline orientation of the recording layer 3 is controlled, and the recording layer 3 becomes a perpendicular magnetization film. The characteristics of the base layer 5 and a method of manufacturing the base layer 5 will be described later in detail.

Figure 6:
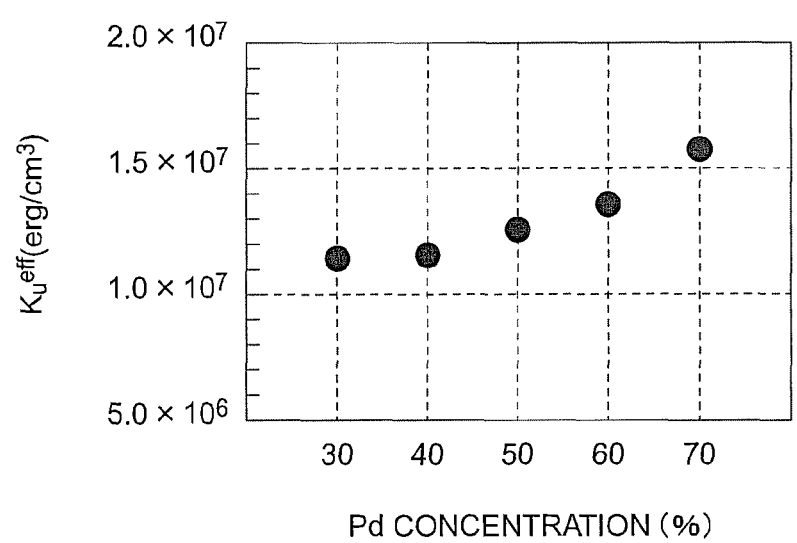
FIG. 6 shows the Pd concentration dependence of a perpendicular magnetic anisotropy.

FIG. 6 shows the Pd concentration dependence of the effective perpendicular magnetic anisotropy $K_u^{\text{eff}}$ of a CoPd film. In FIG. 6, the abscissa axis indicates the Pd concentration, and the ordinate axis indicates the effective magnetic anisotropy $K_u^{\text{eff}}$. As can be seen from FIG. 6, if the Pd concentration is 30 atomic % or higher, a high perpendicular magnetic anisotropy of $1 \times 10^7$ (erg/cm$^3$) or even higher can be achieved. By virtue of such a high perpendicular magnetic anisotropy, it is possible to provide a magnetoresistive element that can maintain a high thermal stability even if the magnetoresistive element is miniaturized. It should be noted that the recording layer 3 can contain an additional element such as nickel (Ni) or vanadium (V).

(Fixed Layer)

Next, the fixed layer in each of the first through fifth embodiments is described. A material having a magnetization direction that is not easily changed with respect to the recording layer 3 is preferably selected as the fixed layer 2. That is, it is preferable to select a material having a high effective magnetic anisotropy $K_u^{\text{eff}}$ and a large saturation magnetization $M_S$, or having a large magnetic relaxation constant $\alpha$. The following materials can be used as the fixed layer 2.

(Ordered Alloys)

An ordered alloy that can be used is an alloy containing at least one element selected from Fe, Co, and Ni, and at least one element selected from Pt and Pd, and the crystalline structure of the alloy is of the L10 type. Examples of such ordered alloys of the L10 type include $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, and $Co_{30}Ni_{20}Pt_{50}$. Those ordered alloys do not necessarily have the above composition ratios.

The effective magnetic anisotropy and the saturation magnetization can be adjusted by adding an impurity element such as Cu (copper), Cr (chromium), or Ag (silver), or an alloy of one or more of those elements, or an insulating material to those ordered alloys. In a case where one of those alloys is used as the fixed layer 2, particularly in a case where a material having a large lattice mismatch with the nonmagnetic layer 4 is selected, the fixed layer 2 preferably has a structure formed by stacking the magnetic film 2a and the magnetic film 2b, as shown in FIGS. 2, 3, and 5.

(Artificial Lattices)

An artificial lattice that can be used is a structure formed by alternately stacking an alloy (a magnetic layer) containing at least one element selected from Fe, Co, and Ni, and an alloy (a nonmagnetic layer) containing at least one element selected from Cr, Pt, Pd, Ir, Rh, Ru, Os, Re, Au, and Cu. Examples of such artificial lattices include a Co/Pt artificial lattice, a Co/Pd artificial lattice, a CoCr/Pt artificial lattice, a Co/Ru artificial lattice, a Co/Os artificial lattice, a Co/Au artificial lattice, and a Ni/Cu artificial lattice. The effective magnetic anisotropy and the saturation magnetization of each of those artificial lattices can be adjusted by adding an element to the magnetic layer, and adjusting the film thickness ratio and the stacking cycles between the magnetic layer and the nonmagnetic layer. In most cases where one of those stack films is used as the fixed layer 2, the lattice mismatch with the nonmagnetic layer 4 is large, which is not preferable when a high TMR is to be achieved. In such cases, the fixed layer 2 preferably has a structure formed by stacking the magnetic film 2a and the magnetic film 2b, as shown in FIGS. 2, 3, and 5.

(Random Alloys)

A random alloy that can be used is a metal that contains cobalt (Co) as the main component, and also contains at least one element selected from chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni). Examples of such random alloys include a CoCr alloy, a CoPt alloy, a CoCrPt alloy, a CoCrPtTa alloy, and a CoCrNb alloy. The effective magnetic anisotropy and the saturation magnetization of each of those alloys can be adjusted by increasing the proportion of the nonmagnetic element. In most cases where one of those alloys is used as the fixed layer 2, the lattice mismatch with the nonmagnetic layer 4 is large, which is not preferable when a high TMR is to be achieved. In such cases, the fixed layer 2 preferably has a structure formed by stacking the magnetic film 2a and the magnetic film 2b, as shown in FIGS. 2, 3, and 5.

(RE (Rare-Earth Metal)-TM (Transition Metal) Alloys)

An alloy of a rare-earth metal and a transition metal can realize either a ferrimagnetic material or a ferromagnetic material, depending on the material of the rare-earth metal. A specific example of such a ferrimagnetic material is an alloy containing terbium (Tb), dysprosium (Dy), or gadolinium (Gd), and at least one element selected form the transition metals. Examples of such ferrimagnetic materials include TbFe, TbCo, TbFeCo, DyTbFeCo, and GdTbCo. A specific example of a ferromagnetic material is an alloy containing samarium (Sm), neodymium (Nd), or holmium (Ho), and at least one element selected from the transition metals. Examples of such ferromagnetic materials include $SmCo_5$ and NdFeB. The magnetic anisotropy and the saturation magnetization of each of those alloys can be adjusted by controlling the composition. In most cases where one of those alloys is used as the fixed layer 2, the lattice mismatch with the nonmagnetic layer 4 is large, which is not preferable when a high TMR is to be achieved. In such cases, the fixed layer 2 preferably has a structure formed by stacking the magnetic film 2a and the magnetic film 2b, as shown in FIGS. 2, 3, and 5.

(Stack Structures of Recording Layer and Fixed Layer)

The magnetic film 3b of the recording layer 3 and the magnetic film 2a of the fixed layer 2 that are in contact with the nonmagnetic layer 4 each have a structure formed by repeating stacking of a magnetic material layer and a nonmagnetic material layer at least twice. Each magnetic material layer included in the magnetic film 3b or the magnetic film 2a is made of an alloy containing at least one element selected from Co, Fe, and Ni. If an oxide having a NaCl structure is used as the nonmagnetic layer 4, a (100) plane is easily grown as the preferential orientation plane in one of the following situations: (i) where crystals are grown on an alloy containing at least one of Fe, Co, and Ni, such as an amorphous CoFeNiB alloy; or (ii) where crystals are grown on an alloy that has a body-centered cubic (BCC) structure, has an (100) preferential orientation plane, and contains at least one of Fe, Co, and Ni. Particularly, a (100) plane can be formed as the preferential orientation plane with greater ease on an amorphous alloy CoFeX to which B, C, N, or the like is added (X being at least one element selected from B, C, and N). Therefore, the magnetic material layer in contact with the nonmagnetic layer 4 is preferably an alloy $(Co_{100-x}Fe_x)_{100-y}B_y$ (x≥25 atomic %, 0≤y≤30 atomic %) containing Co, Fe, and B. Each nonmagnetic material layer included in the magnetic film $3b$ or the magnetic film $2a$ is preferably made of an element that has a high melting point and is selected from Ta, W, Hf, Zr, Nb, Mo, Ti, V, and Cr, or an alloy of one or more of those elements. It should be noted that, if Ta is used as the nonmagnetic material layers, and CoFeB is used as the magnetic material layers, the B in the CoFeB of the magnetic material layers is attracted to the Ta after a heat treatment, and therefore, the B concentration becomes higher as the distance to the Ta layer becomes shorter.

The magnetic film $3b$ and the magnetic film $2a$ each has a structure formed by repeating stacking of a magnetic material layer and a nonmagnetic material layer at least twice. However, the magnetic material layers preferably have magnetically exchanged coupling via the nonmagnetic material layers. Each nonmagnetic material layer is preferably 10 angstroms or less in thickness, or more preferably, 5 angstroms or less in thickness. With this arrangement, the magnetic film $3b$ and the magnetic film $2a$ can have the same magnetization directions as those of the magnetic film $3a$ and the magnetic film $2b$, respectively. As the magnetic film $3a$ and the magnetic film $2b$, those described as the materials for the recording layer and the fixed layer can be used.

Figure 7:
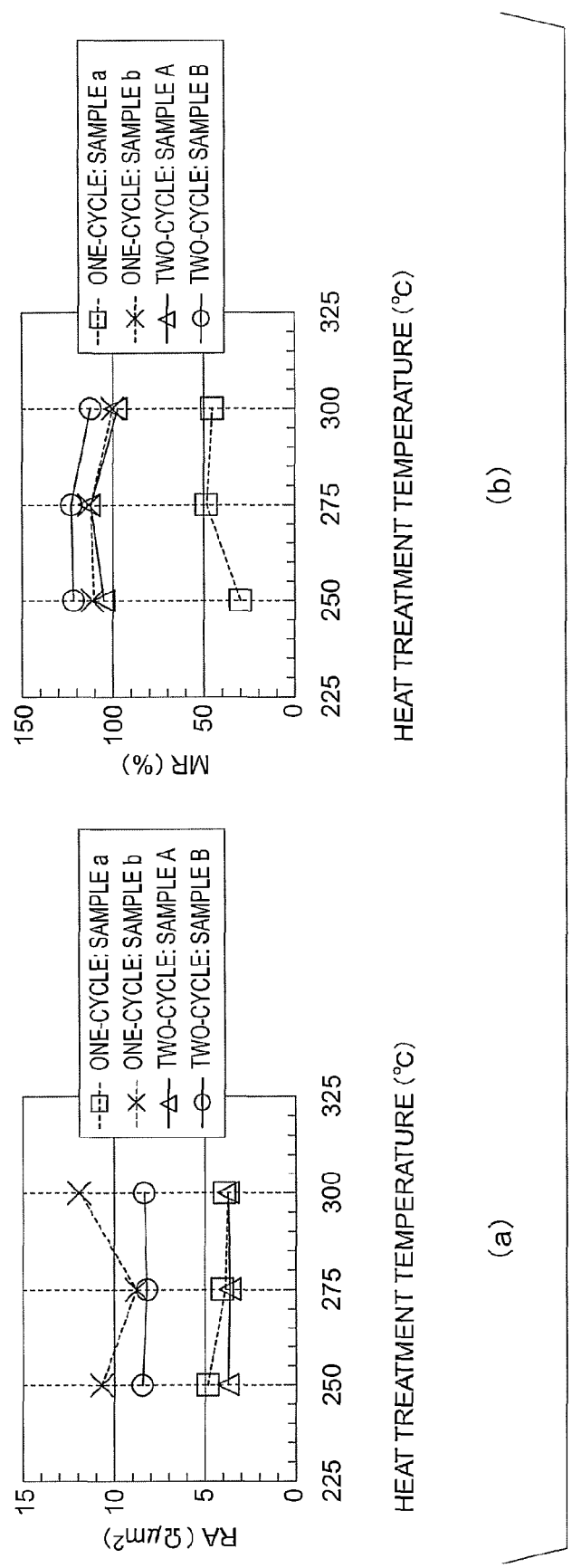
FIGS. 7(*a*) and 7(*b*) show the heat treatment temperature dependences of the resistances and MRs of magnetic films having stack structures.

FIGS. 7(a) and 7(b) show the heat treatment temperature dependences of RAs (areal resistances) and MRs (magnetoresistance changes). As the magnetic films $3b$, samples "A" and "B" each having CoFeB (0.9 nm), Ta (0.1 nm), CoFeB (0.3 nm), and Ta (0.1 nm) stacked in this order from the side of the nonmagnetic layer 4 were formed. The samples "A" and "B" have different thicknesses of the nonmagnetic layer 4 so that the sample "A" has a smaller RA than that of the sample "B". As the magnetic films $3b$, samples "a" and "b" each having CoFeB (1.2 nm) and Ta (0.1 nm) stacked in this order from the side of the nonmagnetic layer 4 were also formed. Each of the samples "A" and "B" has a "two-cycle structure" to which two Ta layers are inserted. Each of the samples "a" and "b" has a "one-cycle structure" to which one Ta layer is inserted. The samples "a" and "b" have different thicknesses of the nonmagnetic layer 4 so that the sample "a" has a smaller RA than that of the sample "b". As can be seen from FIG. 7(a), each of the samples "A" and "B" has a smaller change with respect to the heat treatment temperature than the samples "a" and "b" in any RA region. Also, as can be seen from FIG. 7(b), where the samples "A" and "B" have the same RAs as those of the samples "a" and "b", a high MR ratio can be realized, and this phenomenon is even more remarkable in regions with lower RAs. That is, it has been confirmed that each of the magnetic film $3b$ and the magnetic film $2a$ preferably has a structure formed by repeating the stacking of a magnetic material layer and a nonmagnetic material layer at least twice.

Figure 8:
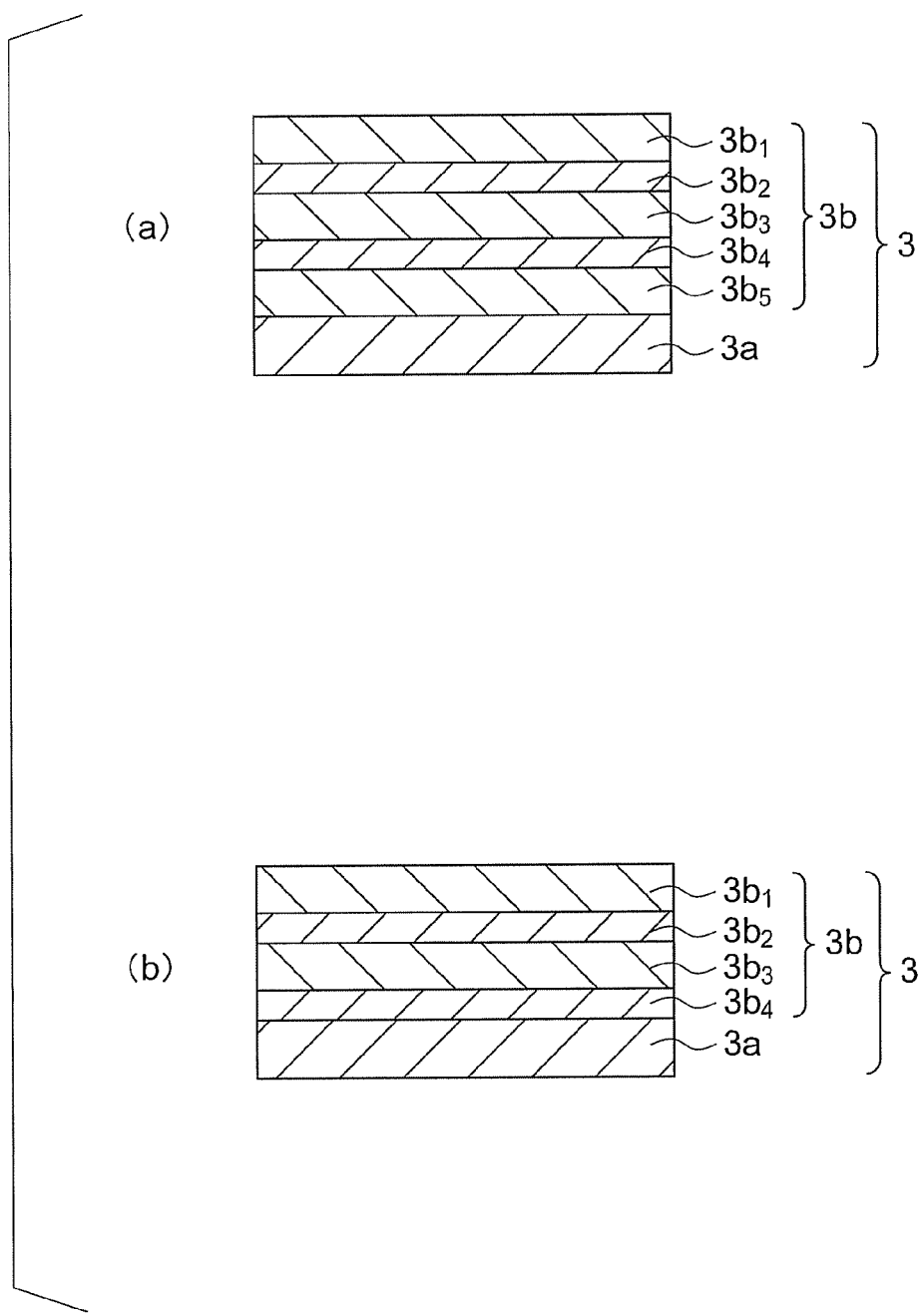
FIGS. 8(*a*) and 8(*b*) are cross-sectional views showing the stack structures of a recording layer.

Therefore, the recording layer 3 in each of the first, third, and fifth embodiments preferably has a structure formed by stacking the magnetic film $3a$ and the magnetic film $3b$, and the magnetic film $3b$ preferably has a structure formed by stacking a magnetic material layer $3b_5$, a nonmagnetic material layer $3b_4$, a magnetic material layer $3b_3$, a nonmagnetic material layer $3b_2$, and a magnetic material layer $3b_1$ in this order between the magnetic film $3a$ and the nonmagnetic layer 4, as shown in FIG. 8(a). In that case, the magnetic material layer $3b_1$ in contact with the nonmagnetic layer 4 is preferably a $(Co_{100-x}Fe_x)_{100-y}B_y$ (x≥25 atomic %, 0≤y≤30 atomic %) layer, as described above. The magnetic material layer $3b_5$ in contact with the magnetic film $3a$ is preferably a $(Co_{100-x}Fe_x)_{100-y}B_y$ (x<25 atomic %, 0≤y≤30 atomic %) layer. Since a material containing CoFePd or CoFePt is used as the magnetic film $3a$, the lattice mismatch becomes smaller if the magnetic material layer $3b_5$ is a $(Co_{100-x}Fe_x)_{100-y}B_y$ (x<25 atomic %, 0≤y≤30 atomic %) layer. The film thickness of the magnetic material layer $3b_1$ in contact with the nonmagnetic layer 4 is preferably large, so as to improve the MR ratio. Therefore, the magnetic material layer $3b_1$, the magnetic material layer $3b_3$, and the magnetic material layer $3b_5$ can have different film thicknesses from one another. The nonmagnetic material layer $3b_2$ and the nonmagnetic material layer $3b_4$ can be made of different materials from each other, and can have different film thicknesses from each other.

Alternatively, the recording layer 3 in each of the first, third, and fifth embodiments has a structure formed by stacking the magnetic film $3a$ and the magnetic film $3b$, and the magnetic film $3b$ can have a structure formed by stacking a nonmagnetic material layer $3b_4$, a magnetic material layer $3b_3$, a nonmagnetic material layer $3b_2$, and a magnetic material layer $3b_1$ in this order between the magnetic film $3a$ and the nonmagnetic layer 4, as shown in FIG. 8(b). In that case, the magnetic material layer $3b_1$ in contact with the nonmagnetic layer 4 is also preferably a $(Co_{100-x}Fe_x)_{100-y}B_y$ (x≥25 atomic %, 0≤y≤30 atomic %) layer. The film thickness of the magnetic material layer $3b_1$ in contact with the nonmagnetic layer 4 is preferably large, so as to improve the MR ratio. Therefore, the magnetic material layer $3b_1$ and the magnetic material layer $3b_3$ can have different film thicknesses from each another. The nonmagnetic material layer $3b_2$ and the nonmagnetic material layer $3b_4$ can be made of different materials from each other, and can have different film thicknesses from each other.

Figure 9:
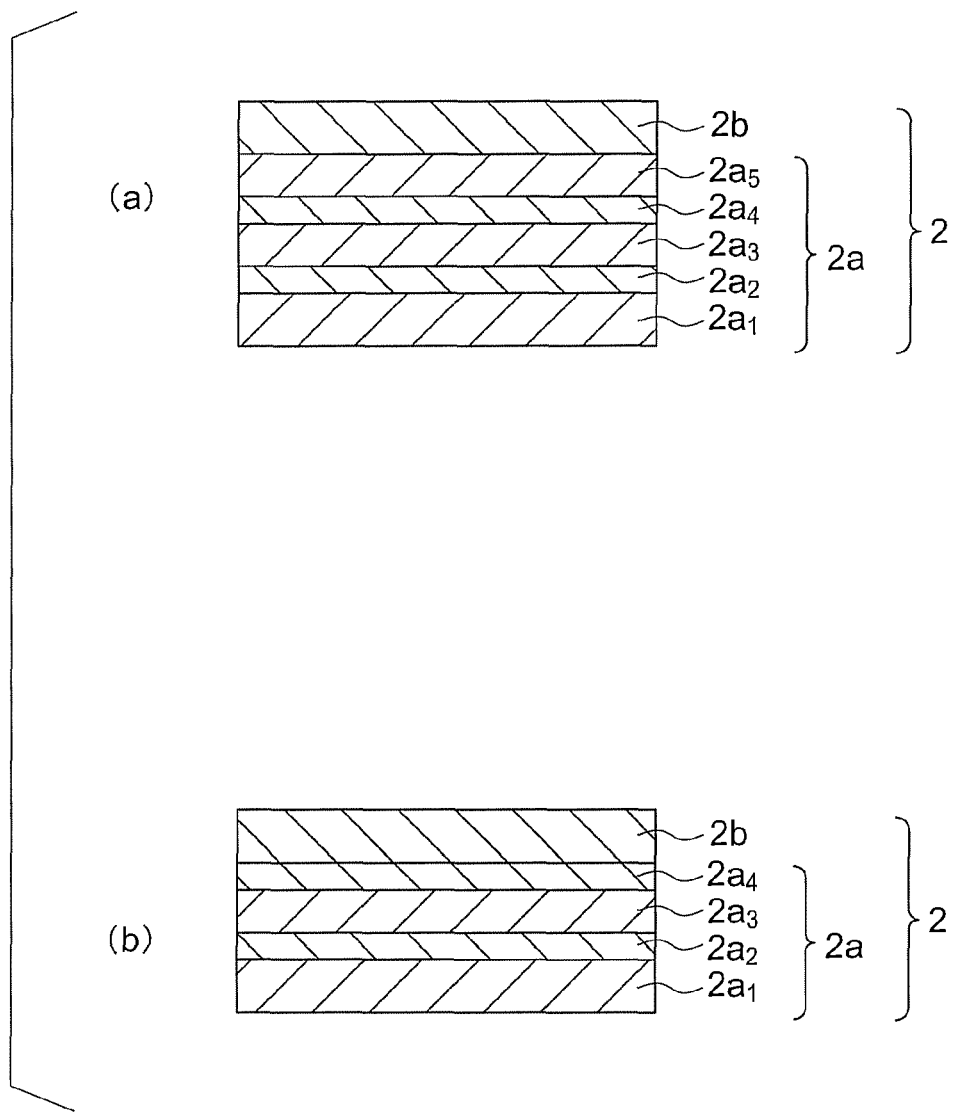
FIGS. 9(*a*) and 9(*b*) are cross-sectional views showing the stack structures of a fixed layer.

Likewise, the fixed layer 2 in each of the second, fourth, and fifth embodiments preferably has a structure formed by stacking the magnetic film $2a$ and the magnetic film $2b$, and the magnetic film $2a$ preferably has a structure formed by stacking a magnetic material layer $2a_1$, a nonmagnetic material layer $2a_2$, a magnetic material layer $2a_3$, a nonmagnetic material layer $2a_4$, and a magnetic material layer $2a_5$ in this order between the nonmagnetic layer 4 and the magnetic film $2b$, as shown in FIG. 9(a). In that case, the magnetic material layer $2a_1$ in contact with the nonmagnetic layer 4 is preferably a $(Co_{100-x}Fe_x)_{100-y}B_y$ (x≥25 atomic %, 0≤y≤30 atomic %) layer, as described above. The magnetic material layer $2a_5$ in contact with the magnetic film $2b$ is preferably a $(Co_{100-x}Fe_x)_{100-y}B_y$ (x<25 atomic %, 0≤y≤30 atomic %) layer. Since a material containing CoFePd or CoFePt is used as the magnetic film $2b$, the lattice mismatch becomes smaller if the magnetic material layer $2a_5$ is a $(Co_{100-x}Fe_x)_{100-y}B_y$ (x<25 atomic %, 0≤y≤30 atomic %) layer. The film thickness of the magnetic material layer $2a_1$ in contact with the nonmagnetic layer 4 is preferably large, so as to improve the MR ratio. Therefore, the magnetic material layer $2a_1$, the magnetic material layer $2a_3$, and the magnetic material layer $2a_5$ can have different film thicknesses from one another. The nonmagnetic material layer $2a_2$ and the nonmagnetic material layer $2a_4$ can be made of different materials from each other, and can have different film thicknesses from each other.

Alternatively, the fixed layer 2 in each of the second, fourth, and fifth embodiments also has a structure formed by stacking the magnetic film $2a$ and the magnetic film $2b$, and the magnetic film $2a$ can have a structure formed by stacking a magnetic material layer $2a_1$, a nonmagnetic material layer $2a_2$, a magnetic material layer $2a_3$, and a nonmagnetic material layer $2a_4$ in this order between the nonmagnetic layer 4 and the magnetic film $2b$, as shown in FIG. 9(b). In that case, the magnetic material layer $2a_1$ in contact with the nonmagnetic layer 4 is also preferably a $(Co_{100-x}Fe_x)_{100-y}B_y$ (x≥25 atomic %, 0≤y≤30 atomic %) layer. The film thickness of the magnetic material layer $2a_1$ in contact with the nonmagnetic layer 4 is preferably large, so as to improve the MR ratio. Therefore, the magnetic material layer $2a_1$ and the magnetic material layer $2a_3$ can have different film thicknesses from each another. The nonmagnetic material layer $2a_2$ and the nonmagnetic material layer $2a_4$ can be made of different materials from each other, and can have different film thicknesses from each other.

As described above, the recording layer 3 or the fixed layer 2 has a structure formed by repeating the stacking of a magnetic material layer and a nonmagnetic material layer at least twice. Accordingly, a magnetoresistive element that has smaller changes in electrical characteristics due to the heat treatment after the film formation, and has a higher heat resistance can be obtained.

(Base Layer 5)

As mentioned in the above description of the recording layer, to form a perpendicular magnetization film having an easy axis of magnetization in a direction perpendicular to the film plane, it is necessary to form a structure in which a close-packed atomic plane is easily oriented. That is, the crystalline orientation needs to be controlled so that the (111) plane of a face-centered cubic (FCC) structure and the (001) plane of a hexagonal close-packed (HCP) structure are oriented. Therefore, the selection of the base layer material and its stack structure are critical.

(Stack Structure of Base Layer)

Figure 10:
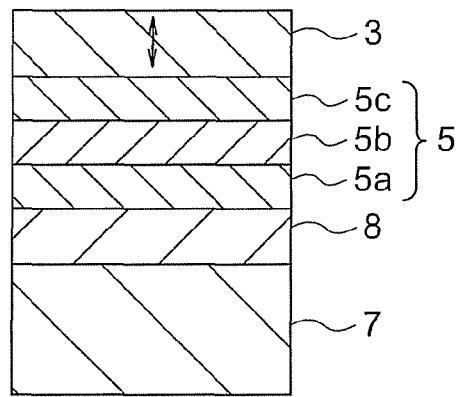
FIG. 10 is a cross-sectional view showing a stack structure including a base layer and a recording layer.

FIG. 10 is a cross-sectional view of a stack structure including the base layer 5 and the recording layer 3. In this stack structure, a Ta layer of approximately 5 nm in film thickness is provided as a contact layer 8 between a lower electrode 7 and the base layer 5. The base layer 5 has a stack structure formed by stacking base films 5a, 5b, and 5c in this order. A CoPd layer of approximately 2 nm in film thickness, for example, is provided as the recording layer 3 on the base layer 5. The structure formed on the CoPd layer is the same as one of those shown in FIGS. 1 through 5.

In the base layer 5 of each magnetoresistive element according to the first through fifth embodiments, the base film 5c can be made of a metal material lattice-matched to CoPd and CoPt alloys. The base film 5a can be made of such a material and has such a structure that the base films 5b and 5c become smooth, and the crystalline orientation is improved. The base films 5b and 5c can be a Ru layer of approximately 3 nm in film thickness and a Pt layer of approximately 3 nm in film thickness, for example.

In the following, specific examples of materials of the base films 5a, 5b, and 5c are described.

(Materials of Base Films)

A metal having a close-packed structure is used as the base film 5c. Examples of metals that are lattice-matched to CoPd alloys and CoPt alloys, and have close-packed structures include Pt, Pd, Ir, and Ru. Alternatively, an alloy containing two elements or three or more elements of the above mentioned metals, such as Pt—Pd or Pt—Ir, instead of a single-element metal, can be used. Also, an alloy of one of the above mentioned metals and a fcc metal such as Cu, Au, or Al can be used. Examples of such alloys include Pt—Cu, Pd—Cu, Ir—Cu, Pt—Au, Ru—Au, Pt—Al, and Ir—Al. Further, an alloy of one of the above metals and a hcp metal such as Re, Ti, Zr, or Hf can be used. Examples of such alloys include Pt—Re, Pt—Ti, Ru—Re, Ru—Ti, Ru—Zr, and Ru—Hf. If the film thickness is too large, the smoothness becomes poorer. Therefore, the film thickness is preferably 30 nm or smaller. The base films 5b and 5c are stacked, because the lattice constants are adjusted by stacking materials having different lattice constants prior to the formation of a CoPd alloy or a CoPt alloy. For example, in a case where the base film 5b is made of Ru, and the base film 5c is made of Pt, the Pt of the base film 5c is affected by the Ru of the base film 5b, and is made to have a lattice constant different from the bulk lattice constant. However, since the lattice constant can be adjusted by using an alloy as described above, one of the base films 5b and 5c can be omitted.

In the base layer 5, the base film 5a is used to improve the smoothness and the crystalline orientations of the metals forming the close-packed structures of the base films 5b and 5c. A specific example of the material of the base film 5a is Ta. If the base film 5a is too thick, the film formation takes too long a time, resulting in poorer productivity. If the base film 5a is too thin, the above described effect to control orientations is lost. Therefore, the film thickness of the base film 5a is preferably in the range of 1 nm to 10 nm.

(Nonmagnetic Layer 4)

The material of the nonmagnetic layer 4 in each of the first through fifth embodiments is preferably an oxide having a NaCl structure. Specific examples of such oxides include MgO, CaO, SrO, TiO, VO, and NbO. A (100) plane is easily grown as the preferential orientation plane, if the oxide having a NaCl structure is grown in one of the following situations: (i) where crystals are grown on an alloy containing one of Fe, Co, and Ni or two or more of Fe, Co, and Ni as the main components, such as an amorphous CoFeNiB alloy; or (ii) where crystals are grown on an alloy that has a body-centered cubic (BCC) structure, has an (100) preferential orientation plane, and contains one of Fe, Co, and Ni or two or more of Fe, Co, and Ni as the main components.

Particularly, a (100) plane can be formed as the preferential orientation plane with greater ease on an amorphous alloy CoFeX to which B, C, N, or the like is added (X being at least one element selected from B, C, and N).

In a case where the magnetization direction of the recording layer 3 and the magnetization direction of the fixed layer 2 are antiparallel to each other, the spin-polarized $\Delta_1$ band functions to carry out tunnel conduction, and therefore, only the majority spin electrons contribute to conduction. As a result, the conductivity of the magnetoresistive element becomes lower, and the resistance value becomes larger. In a case where the magnetization direction of the recording layer 3 and the magnetization direction of the fixed layer 2 are parallel to each other, the $\Delta_5$ band that is not spin-polarized dominates conduction. As a result, the conductivity of the magnetoresistive element becomes higher, and the resistance value becomes smaller. Therefore, the formation of the $\Delta_1$ band is critical in achieving a high TMR. To form the $\Delta_1$ band, there should be a high consistency between the interfaces of the (100) plane of the nonmagnetic layer 4 made of an oxide having a NaCl structure with the recording layer 3 and the fixed layer 2.

To improve the lattice match in the (100) plane of the nonmagnetic layer 4 made of an oxide layer having a NaCl structure, the recording layer and the fixed layer are preferably stack structures as described above. To form the $\Delta_1$ band, it is more preferable to select a material of 5% or lower in lattice mismatch in the (100) plane of the nonmagnetic layer 4, and use the material as the magnetic film 3b of the recording layer 3 and the magnetic film 2a of the fixed layer 2.

(Bias Layer)

As shown in FIG. 4 or 5, the nonmagnetic layer 21 and the bias layer (the shift adjustment layer) 22 can be provided between the fixed layer 2 and the cap layer 6. With this arrangement, the shift of the switching current in the recording layer 3 due to a leak field generated from the fixed layer 2 can be reduced and adjusted.

The nonmagnetic layer 21 preferably has such a heat resistance that the fixed layer 2 and the bias layer 22 do not mix with each other in the heating process, and has the function to control the crystalline orientation when the bias layer 22 is formed. Further, as the film thickness of the nonmagnetic layer 21 becomes greater, the distance between the bias layer 22 and the recording layer 3 becomes longer, and the shift adjustment magnetic field to be applied from the bias layer 22 to the recording layer 3 becomes smaller. Therefore, the film thickness of the nonmagnetic layer 21 is preferably 5 nm or smaller.

The bias layer 22 is made of a ferromagnetic material having an easy axis of magnetization in a direction perpendicular to the film plane. Specifically, the materials mentioned as those which can be used for the fixed layer 2 can be used. However, since the bias layer 22 is further away from the recording layer 3 than the fixed layer 2, the film thickness or the saturation magnetization $M_S$ of the bias layer 22 needs to be greater than that of the fixed layer 2 so that the leak field applied to the recording layer 3 is adjusted by the bias layer 22.

Where $t_2$ and $M_{S2}$ represent the film thickness and the saturation magnetization of the fixed layer 2, and $t_{22}$ and $M_{S22}$ represent the film thickness and the saturation magnetization of the bias layer 22, the following relationship needs to be satisfied:

$$M_{S2} \times t_2 < M_{S22} \times t_{22} \qquad (2)$$

In a case where the device size is 50 nm in a hypothetical manufacturing process, for example, a magnetic material having a saturation magnetization Ms of 1000 emu/cm$^3$ and a film thickness of 5 nm is used as the fixed layer 2, so as to cancel the shift of the switching current. In that case, the following bias layer characteristics are required: the film thickness of the nonmagnetic layer 21 is 3 nm, the saturation magnetization Ms of the bias layer 22 is 1000 emu/cm$^3$, and the film thickness of the bias layer 22 is approximately 15 nm.

To cancel the above described shift, the magnetization directions of the fixed layer 2 and the bias layer 22 need to be made antiparallel to each other. To set the magnetization directions in this manner, a material that satisfies the following relationship between the coercive force $H_{c2}$ of the fixed layer 2 and the coercive force $H_{c22}$ of the bias layer 22 should be selected: $H_{c2} > H_{c22}$ or $H_{c2} < H_{c22}$. In that case, the magnetization direction of the layer with the smaller coercive force is reversed beforehand by minor loop magnetizing. In this manner, the magnetization directions of the fixed layer 2 and the bias layer 22 can be made antiparallel to each other.

The magnetization directions of the fixed layer 2 and the bias layer 22 can also be made antiparallel to each other by antiferromagnetically coupling the fixed layer 2 and the bias layer 22 to each other via the nonmagnetic layer 21 (SAF (Synthetic Anti-Ferromagnetic) coupling). Specifically, ruthenium (Ru) is used as the material of the nonmagnetic layer 21, for example. With this arrangement, the fixed layer 2 and the bias layer 22 can be coupled to each other so that the magnetization directions of the fixed layer 2 and the bias layer 22 can be made antiparallel to each other. Accordingly, the leak field generated from the fixed layer 2 can be reduced by the bias layer 22, and the shift of the switching current of the recording layer 3 can be made smaller. As a result, the variation of the switching current of the recording layer 3 among devices can also be made smaller.

As described above, according to the first through fifth embodiments, the recording layer or the fixed layer is designed to have a structure formed by repeating stacking of a magnetic material layer and a nonmagnetic material layer at least twice. Accordingly, a magnetoresistive element that has a smaller change in electric characteristics due to the heat treatment after the film formation, and has a high heat resistance can be obtained. That is, a magnetoresistive element for spin torque transfer switching technique that is thermally stable and can have a magnetization switching with a low current can be obtained.

Also, an oxide having a NaCl structure is used as the nonmagnetic layer 4, and the recording layer 3 or the fixed layer 2 is designed to have a stack structure. Accordingly, the lattice match in the (100) plane of the nonmagnetic layer 4 can be further improved.

(Sixth Embodiment)

Figure 11:
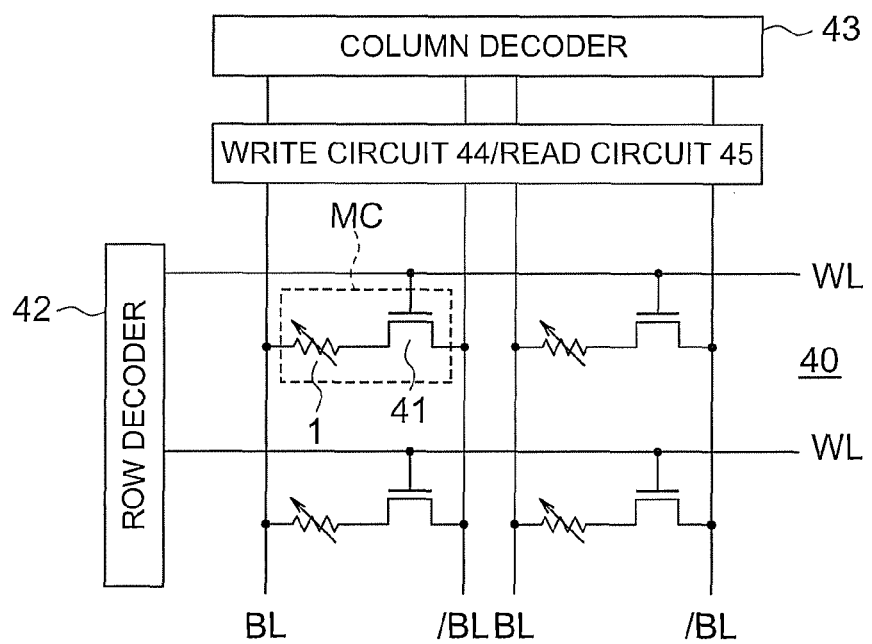
FIG. 11 is a circuit diagram showing a MRAM according to a sixth embodiment.
Figure 12:
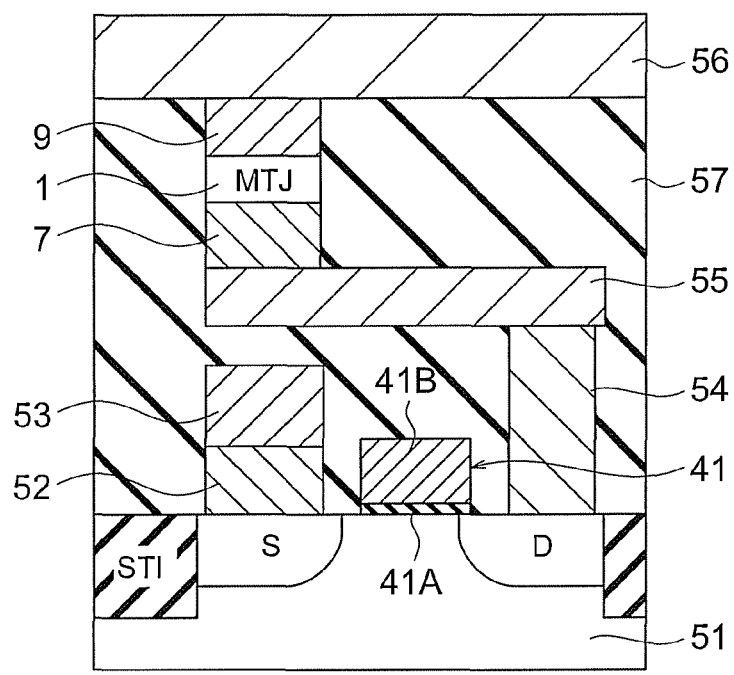
FIG. 12 is a cross-sectional view showing a memory cell MC.

Referring now to FIGS. 11 and 12, a magnetic random access memory (MRAM) according to a sixth embodiment is described. The MRAM of the sixth embodiment has a structure in which magnetoresistive elements according to one of the first through fifth embodiments are used as memory elements. In the following description, each magnetoresistive element is the magnetoresistive element 1 of the first embodiment.

FIG. 11 is a circuit diagram showing the structure of the MRAM according to the sixth embodiment. The MRAM of the sixth embodiment includes a memory cell array 40 having memory cells MC arranged in a matrix fashion. In the memory cell array 40, pairs of bit lines BL and /BL are arranged to extend in the column direction. Also, in the memory cell array 40, word lines WL are arranged to extend in the row direction.

The memory cells MC are placed at the intersections of the bit lines BL with the word lines WL. Each of the memory cells MC includes the magnetoresistive element 1 and a select transistor 41 that is an N-channel MOS transistor. One terminal of the magnetoresistive element 1 is connected to the corresponding bit line BL. The other terminal of the magnetoresistive element 1 is connected to the drain terminal of the select transistor 41. The gate terminal of the select transistor 41 is connected to the corresponding word line WL. The source terminal of the select transistor 41 is connected to the corresponding bit line /BL.

A row decoder 42 is connected to the word line WL. A write circuit 44 and a read circuit 45 are connected to the pairs of bit lines BL and /BL. A column decoder 43 is connected to the write circuit 44 and the read circuit 45. Each of the memory cells MC is to be selected by the row decoder 42 and the column decoder 43.

Data is written into a memory cell MC in the following manner. First, to select the memory cell MC into which data is to be written, the word line WL connected to the memory cell MC is activated. As a result of this, the select transistor 41 is turned on.

A bidirectional write current Iw is then supplied to the magnetoresistive element 1 in accordance with the data to be written. Specifically, when the write current Iw is supplied to the magnetoresistive element 1 from left to right, the write circuit 44 applies a positive voltage to the bit line BL, and applies a ground voltage to the bit line /BL. When the write current Iw is supplied to the magnetoresistive element 1 from right to left, the write circuit 44 applies a positive voltage to the bit line /BL, and applies a ground voltage to the bit line BL. In this manner, data "0" or data "1" can be written into the memory cell MC.

Data is read from a memory cell MC in the following manner. First, the select transistor 41 of the selected memory cell MC is turned on. The read circuit 45 supplies a read current Ir flowing from right to left, for example, to the magnetoresistive element 1. Based on the read current Ir, the read circuit 45 detects the resistance value of the magnetoresistive element 1. In this manner, the data stored in the magnetoresistive element 1 can be read out.

Referring now to FIG. 12, the structure of the MRAM is described. FIG. 12 is a cross-sectional view of a memory cell MC. A device isolation insulating layer is formed in the surface region of a P-type semiconductor substrate 51, and the portion of the surface region of the semiconductor substrate 51 in which the device isolation insulating layer is not formed serves as the active area in which the device is to be formed. The device isolation insulating layer is formed by STI (Shallow Trench Isolation), for example. For the STI, silicon oxide is used, for example.

In the active area of the semiconductor substrate 51, a source region S and a drain region D are formed at a distance from each other. The source region S and the drain region D are $N^+$-type diffusion regions formed by introducing high-concentration $N^+$-type impurities into the semiconductor substrate 51. A gate electrode 41B is formed on a portion of the semiconductor substrate 51 via a gate insulating film 41A. The portion of the semiconductor substrate 51 is located between the source region S and the drain region D. The gate electrode 41B functions as the word line WL. In this manner, the select transistor 41 is formed on the semiconductor substrate 51.

A wire layer 53 is formed above the source region S via a contact 52. The wire layer 53 functions as the bit line /BL. A leading wire 55 is formed above the drain region D via a contact 54. The magnetoresistive element 1 interposed between a lower electrode 7 and an upper electrode 9 is provided above the leading wire 55. A wire layer 56 is formed on the upper electrode 9. The wire layer 56 functions as the bit line BL. The space between the semiconductor substrate 51 and the wire layer 56 is filled with an interlayer insulating layer 57 made of silicon oxide, for example.

As described above in detail, according to the sixth embodiment, a MRAM can be formed with the use of the magnetoresistive elements 1. It should be noted that the magnetoresistive elements 1 can be used not only as spin-injection magnetic memories but also as magnetic memories of a domain-wall displacement type.

The MRAM according to the sixth embodiment can be used in various apparatuses. In the following, a few examples of applications of the MRAM are described.

(Example Application 1)

Figure 13:
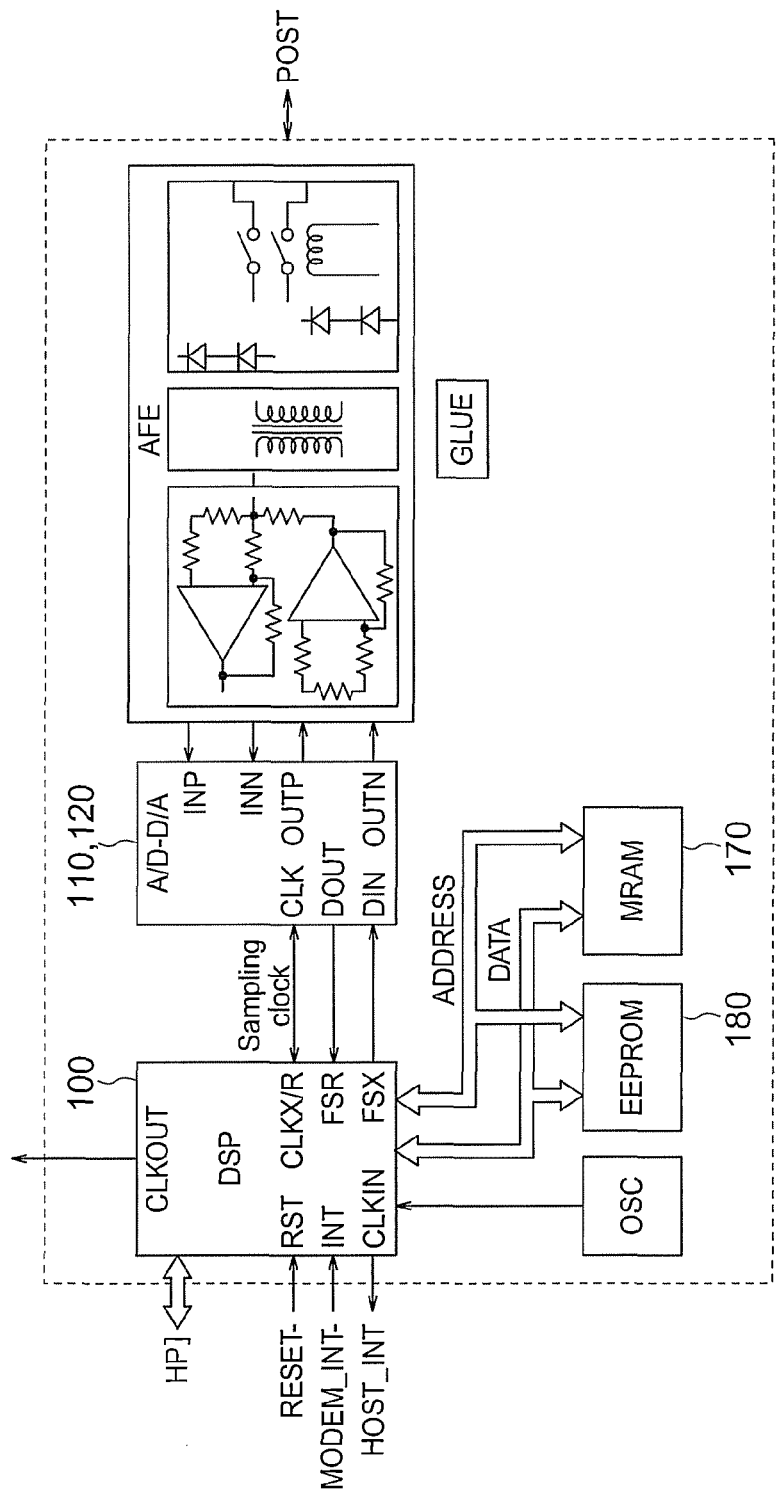
FIG. 13 is a block diagram showing the DSL data path unit of a DSL modem.

FIG. 13 shows the DSL data path unit of a modem for digital subscriber lines (DSLs). The modem includes a programmable digital signal processor (DSP) 100, an analog-digital (A/D) converter 110, a digital-analog (D/A) converter 120, a transmission driver 130, and a receiver amplifier 140.

In FIG. 13, no bandpass filters are shown. Instead, a MRAM 170 according to the sixth embodiment and an EEPROM 180 are shown as memories for various options that store line code programs (programs that are to be executed by the DSP to select and operate the modem in accordance with coded subscriber line information, transmission conditions, and the like (line codes: QAM, CAP, RSK, FM, AM, PAM, DWMT, and the like).

In this example application, the two kinds of memories, the MRAM 170 and the EEPROM 180, are used as the memories to store the line code programs. However, the EEPROM 180 can be replaced with a MRAM. That is, only MRAMs can be used, instead of the two kinds of memories.

(Example Application 2)

Figure 14:
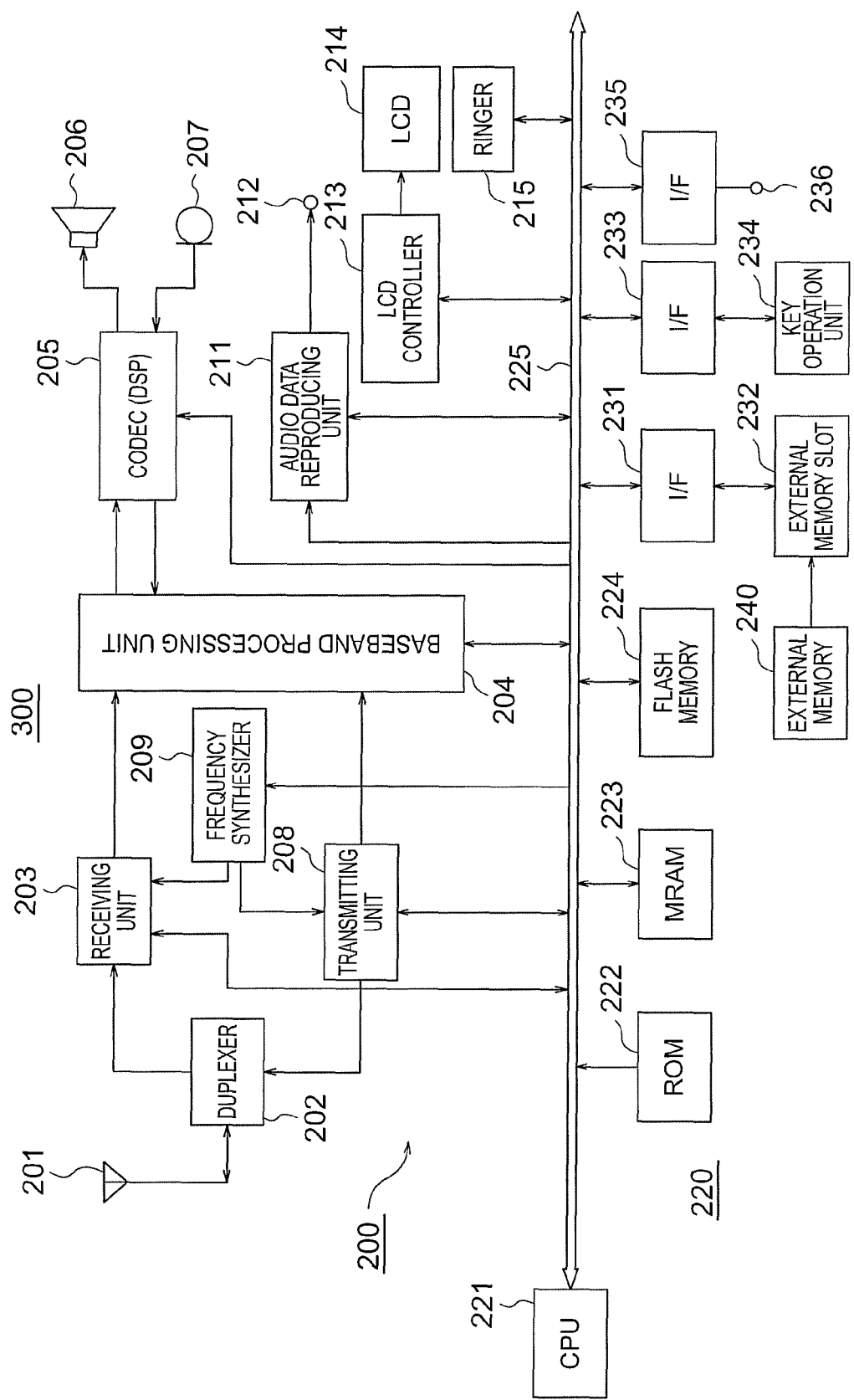
FIG. 14 is a block diagram showing a mobile phone terminal.

FIG. 14 shows a mobile phone terminal 300 as another example application. The communication unit 200 that realizes communication functions includes a transmission/reception antenna 201, an antenna duplexer 202, a receiving unit 203, a baseband processing unit 204, a DSP (digital signal processor) 205 to be used as an audio codec, a speaker (a receiver) 206, a microphone (a transmitter) 207, a transmitting unit 208, and a frequency synthesizer 209.

The mobile phone terminal 300 also includes a control unit 220 that controls the respective components of the mobile phone terminal 300. The control unit 220 is a microcomputer formed by connecting a CPU 221, a ROM 222, a MRAM 223 according to the sixth embodiment, and a flash memory 224 via a bus 225. The programs to be executed by the CPU 221 and the necessary data such as display fonts are stored beforehand in the ROM 222.

The MRAM 223 is used mainly as the work area. Specifically, the MRAM 223 is used when data being calculated by the CPU 221 needs to be stored in the middle of execution of a program, or when data being exchanged between the control unit 220 and the respective components is temporarily stored, for example. The flash memory 224 stores the set conditions of the previous operation even when the power of the mobile phone terminal 300 is switched off, and stores the set parameters for use in a case where the same settings as those of the previous operation are used when the power is switched on next time. With this arrangement, the stored set parameters are not lost even when the power of the mobile phone terminal 300 is switched off.

The mobile phone terminal 300 also includes an audio data reproducing unit 211, an external output terminal 212, a LCD controller 213, a LCD (liquid crystal display) 214 for displaying, and a ringer 215 that generates the beeping sound. The audio data reproducing unit 211 reproduces audio data that is input to the mobile phone terminal 300 (or the audio information (audio data) stored in the later described external memory 240). The reproduced audio data (audio information) is transmitted to a headphone or a mobile speaker or the like via the external output terminal 212. In this manner, the reproduced audio data can be retrieved outside.

With the audio data reproducing unit 211, audio information can be reproduced as described above. The LCD controller 213 receives display information from the CPU 221 via the bus 225, transforms the display information into LCD control information for controlling the LCD 214, and drives the LCD 214 to perform displaying, for example.

The mobile phone terminal 300 further includes interface circuits (I/F) 231, 233, and 235, an external memory 240, an external memory slot 232, a key operation unit 234, and an external input/output terminal 236. An external memory 240 such as a memory card is inserted into the external memory slot 232. The external memory slot 232 is connected to the bus 225 via the interface circuit (I/F) 231.

As the slot 232 is provided in the mobile phone terminal 300 as described above, the information stored in the mobile phone terminal 300 can be written into the external memory 240, and the information (such as audio information) stored in the external memory 240 can be input to the mobile phone terminal 300.

The key operation unit 234 is connected to the bus 225 via the interface circuit (I/F) 233. Key input information that is input from the key operation unit 234 is transferred to the CPU 221, for example. The external input/output terminal 236 is connected to the bus 225 via the interface circuit (I/F) 235. The external input/output terminal 236 functions as the terminal that is used when various kinds of information are input from the outside to the mobile phone terminal 300 or when information is output from the mobile phone terminal 300 to the outside.

In this example application, the ROM 222, the MRAM 223, and the flash memory 224 are used. However, the flash memory 224 can be replaced with a MRAM, and the ROM 222 can also be replaced with a MRAM.

(Example Application 3)

Figure 15:
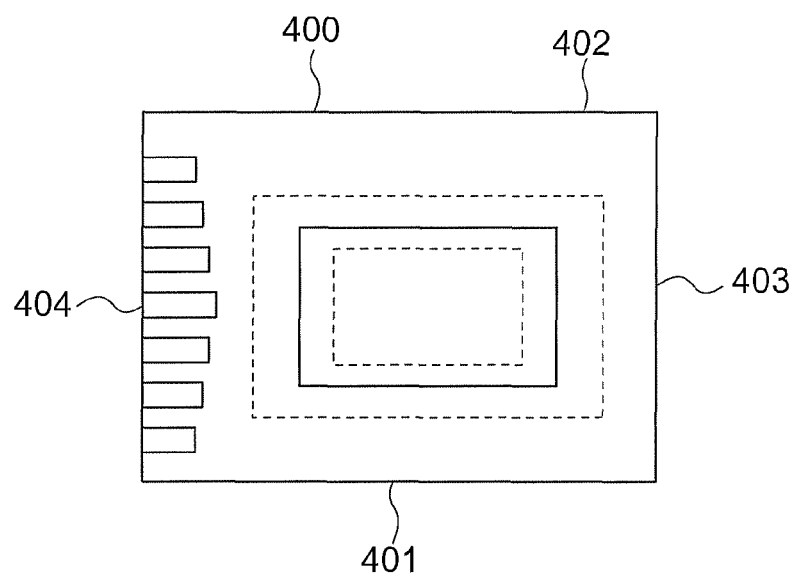
FIG. 15 is a top view showing a MRAM card.

FIGS. 15 through 19 each show an example case where an MRAM is used in a card (a MRAM card) that stores content of media such as smart media. As shown in FIG. 15, a MRAM chip 401 is housed in a MRAM card main unit 400. In the card main unit 400, an opening 402 is formed at a location corresponding to the MRAM chip 401, so that the MRAM chip 401 is exposed. A shutter 403 is provided to cover the opening 402, and the MRAM chip 401 is protected by the shutter 403 when the MRAM card is being carried around. The shutter 403 is made of a material that can shield external magnetic fields, such as ceramics.

When data is transferred, the shutter 403 is released, and the MRAM chip 401 is exposed. An external terminal 404 is used to retrieve the content data from the MRAM card to the outside.

Figure 16:
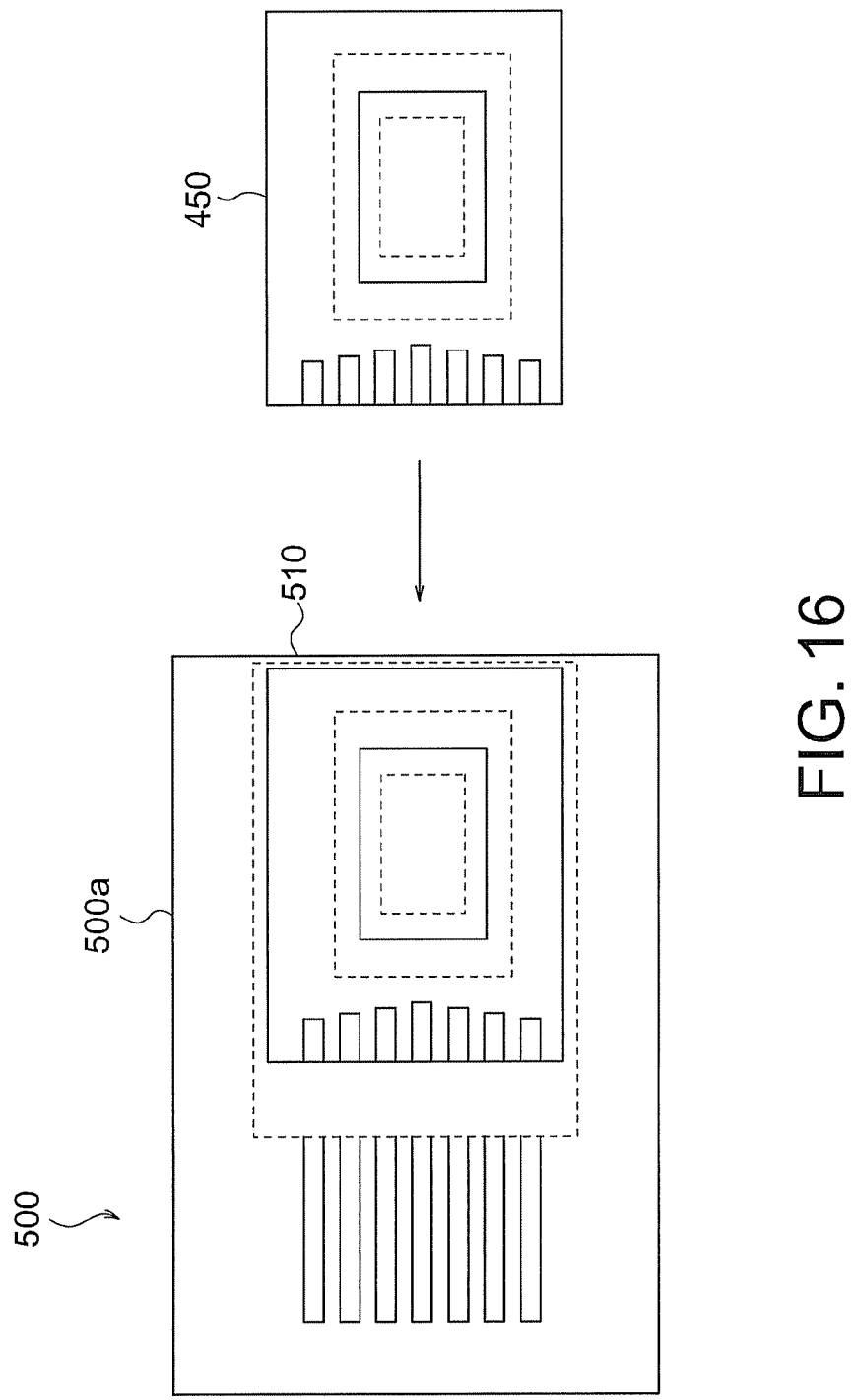
FIG. 16 is a plan view showing a transfer device.
Figure 17:
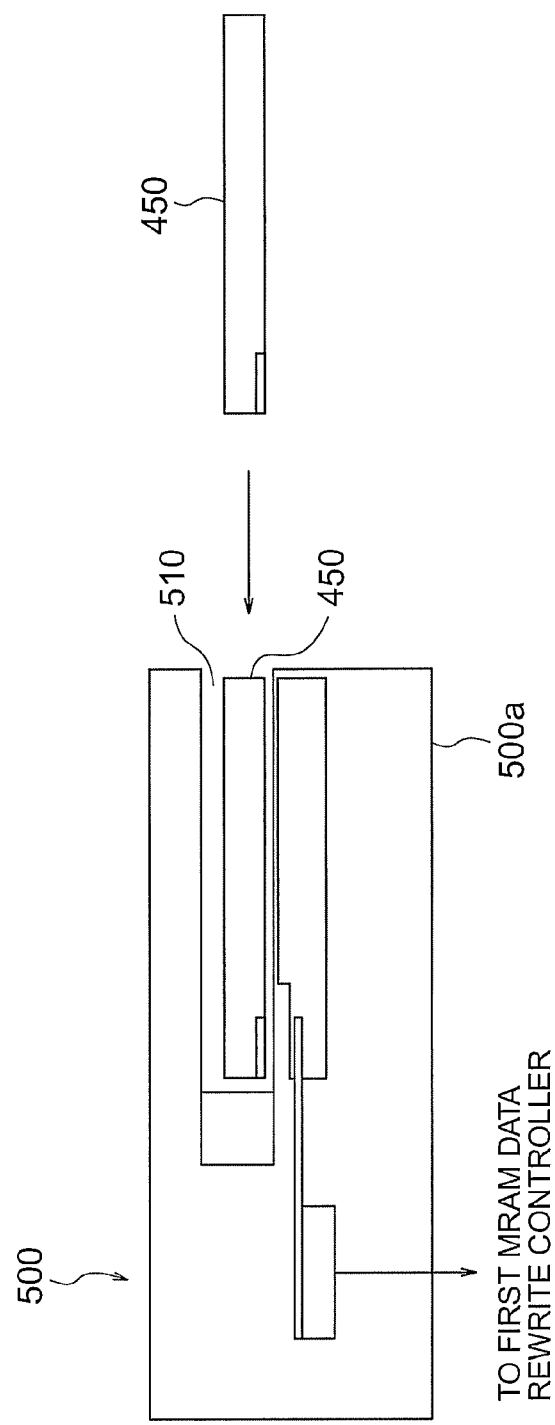
FIG. 17 is a cross-sectional view showing the transfer device.

FIGS. 16 and 17 show a transfer device of a card insertion type for transferring data to a MRAM card. A data transfer device 500 includes a housing 500a. A first MRAM card 550 is housed in the housing 500a. The housing 500a has an external terminal 530 electrically connected to the first MRAM card 550, and the data stored in the first MRAM card 550 is rewritten with the use of the external terminal 530.

A second MRAM card 450 used by an end user is inserted into an insertion portion 510 of the transfer device 500 as indicated by the arrow, and is pushed until stopped by a stopper 520. The stopper 520 also functions as the member for positioning the first MRAM card 550 and the second MRAM card 450. When the second MRAM card 450 is set in a predetermined position, a control signal is supplied from a first MRAM data rewrite controller to the external terminal 530, and the data stored in the first MRAM card 550 is transferred to the second MRAM card 450.

Figure 18:
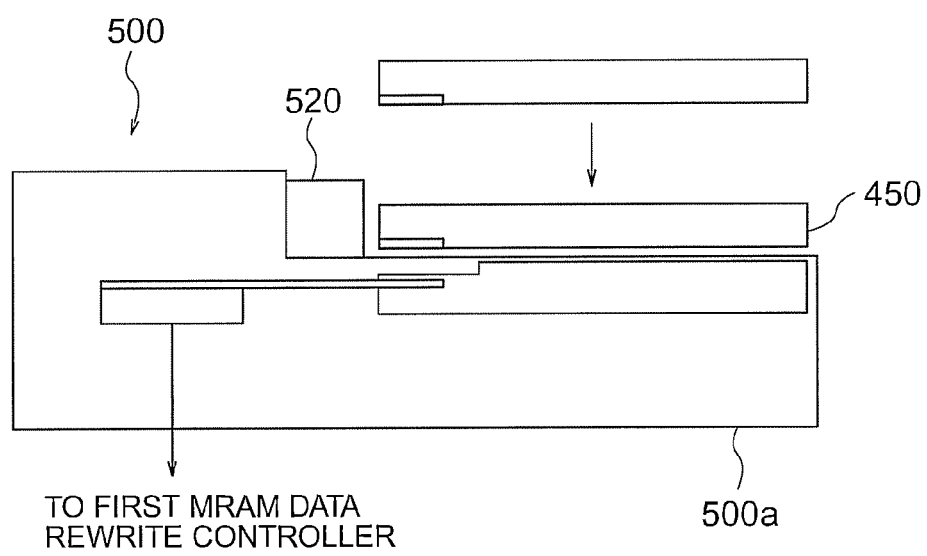
FIG. 18 is a cross-sectional view showing a transfer device of a set-in type.

FIG. 18 is a cross-sectional view showing a transfer device of a set-in type. In the transfer device 500, the second MRAM card 450 is placed on the first MRAM card 550 in a set-in manner as indicated by the arrow, with the stopper 520 serving as the mark. The transfer method is the same as the method used in the transfer device of the card insertion type, and therefore, explanation thereof is not repeated herein.

Figure 19:
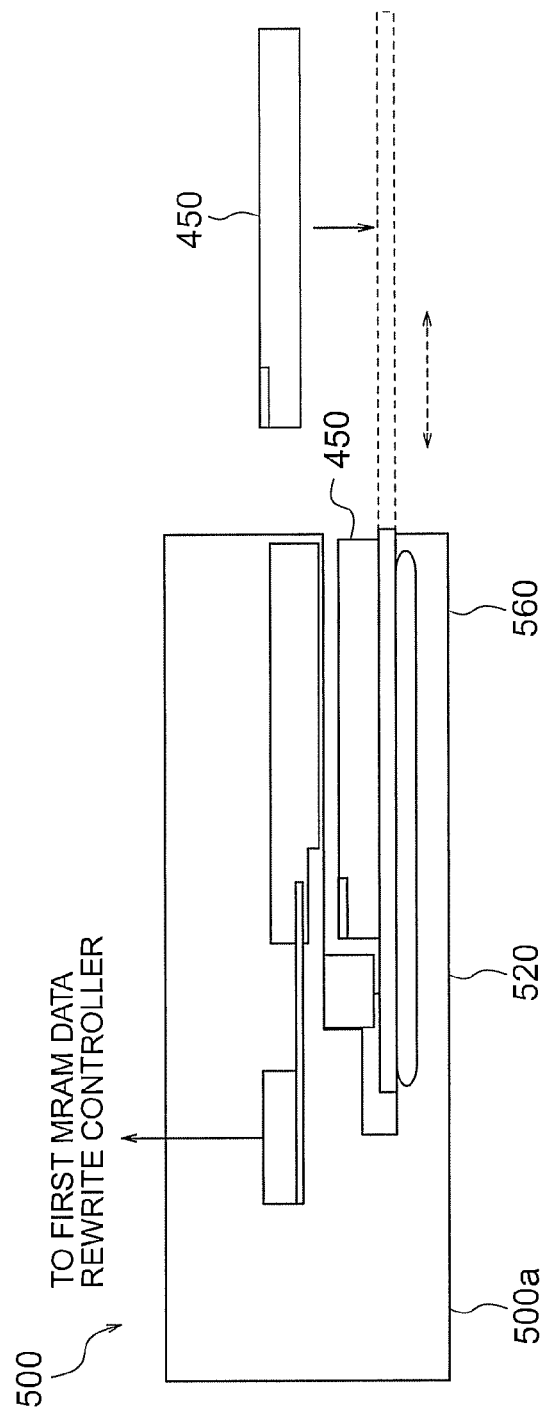
FIG. 19 is a cross-sectional view showing a transfer device of a sliding type.

FIG. 19 is a cross-sectional view showing a transfer device of a sliding type. Like a CD-ROM drive or a DVD drive, the transfer device 500 includes a sliding tray 560, and the sliding tray 560 moves as indicated by the arrows. When the sliding tray 560 is moved to the position shown by the dashed line, the second MRAM card 450 is placed on the sliding tray 560, and the second MRAM card 450 is transported into the transfer device 500.

The top end of the second MRAM card 450 being transported is brought into contact with the stopper 520 in the same manner as in the transfer device of the card insertion type. Also, the transfer method is the same as the method used in the transfer device of the card insertion type, and therefore, explanation thereof is not repeated herein.

The MRAM according to the sixth embodiment can be used in file memories compatible with high-speed random rewriting, portable terminals compatible with high-speed downloading, portable players compatible with high-speed downloading, semiconductor memories for broadcast equipment, drive recorders, home video units, large-capacity buffer memories for communications, semiconductor memories for security cameras, and the like. In this manner, the MRAM according to the sixth embodiment is extremely useful in industrial applications.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A magnetoresistive element comprising:
    a first magnetic layer having an easy axis of magnetization in a direction perpendicular to a film plane;
    a second magnetic layer having an easy axis of magnetization in a direction perpendicular to the film plane; and
    a first nonmagnetic layer interposed between the first magnetic layer and the second magnetic layer,
    at least one of the first magnetic layer and the second magnetic layer comprising a structure formed by stacking a first magnetic film and a second magnetic film, the second magnetic film located closer to the first nonmagnetic layer than the first magnetic film,
    the second magnetic film comprising a stacked structure formed by alternating, at least twice, stacked layers of a magnetic material layer and a nonmagnetic material layer,
    the nonmagnetic material layers of the second magnetic film comprising at least one element selected from the group consisting of Ta, W, Hf, Zr, Nb, Mo, Ti, V, and Cr, and
    one of the first magnetic layer and the second magnetic layer having a magnetization direction that is capable of changing in response to applying a current between the first magnetic layer and the second magnetic layer via the first nonmagnetic layer,
    wherein, among the magnetic material layers of the second magnetic film, the magnetic material layer farthest from the first nonmagnetic layer is a $(Co_{100-x}Fe_x)_{100-y}B_y$ (x<25 atomic %, 0≤y≤30 atomic %) layer.

2. The magnetoresistive element according to claim 1, wherein, among the magnetic material layers of the second magnetic film, the magnetic material layer closest to the first nonmagnetic layer is a $(Co_{100-x}Fe_x)_{100-y}B_y$ (x≥25 atomic %, 0≤y≤30 atomic %) layer.

3. The magnetoresistive element according to claim 1, wherein each of the nonmagnetic material layers is 10 angstroms or less in film thickness.

4. The magnetoresistive element according to claim 1, wherein the first magnetic film is one of a CoFePd film and a CoFePt film.

5. The magnetoresistive element according to claim 1,
    wherein one of the first magnetic layer and the second magnetic layer is a fixed layer having a fixed magnetization, and
    wherein the magnetoresistive element further comprises a third magnetic layer having a magnetization direction antiparallel to the magnetization direction of the fixed layer, the third magnetic layer formed on the opposite side of the fixed layer from the first nonmagnetic layer.

6. The magnetoresistive element according to claim 5, wherein
    a second nonmagnetic layer is interposed between the fixed layer and the third magnetic layer, and
    the fixed layer and the third magnetic layer are antiferromagnetically coupled to each other.

7. A magnetoresistive element comprising:
    a first magnetic layer having an easy axis of magnetization in a direction perpendicular to a film plane;

a second magnetic layer having, an easy axis of magnetization in a direction perpendicular to the film plane; and
a first nonmagnetic layer interposed between the first magnetic layer and the second magnetic layer,
at least one of the first magnetic layer and the second magnetic layer comprising a structure formed by stacking a first magnetic film and a second magnetic film, the second magnetic film located closer to the first nonmagnetic layer than the first magnetic layer,
the second magnetic film comprising a stacked structure formed by alternating, at least twice, stacked layers of a magnetic material layer and a nonmagnetic material layer,
the nonmagnetic material layer of the second magnetic film comprising at least one of element selected from the group consisting of Ta, w, Hf, Zr, Nb, Mo, Ti, V, and Cr, and
one of the first magnetic layer and the second magnetic layer having a magnetization direction that is capable of changing in response to applying a current between the first magnetic layer and the second magnetic layer via the first nonmagnetic layer,
wherein one of the first magnetic layer and the second magnetic layer is a fixed layer having a fixed magnetization,
wherein the magnetoresistive element further comprises a third magnetic layer Having a magnetization direction antiparallel to the magnetization direction of the fixed layer, the third magnetic layer formed on the opposite side of the fixed layer from the first nonmagnetic layer, and
wherein the following relationship is satisfied:

$$M_{S2} \times t_2 < M_{S22} \times t_{22},$$

where $t_2$ and $M_{S2}$ represent a film thickness and a saturation magnetization of the fixed layer, and $t_{22}$ and $M_{22}$ represent a film thickness and a saturation magnetization of the third magnetic layer.

8. The magnetoresistive element according to claim 1, wherein the first nonmagnetic layer is an oxide layer having a NaCl structure.

9. A magnetic memory comprising:
a memory cell comprising a magnetoresistive element according to claim 1;
a first wire electrically connected to a first end of the magnetoresistive element; and
a second wire electrically connected to a second end of the magnetoresistive element.

10. The magnetic memory according to claim 9, wherein the memory cell further comprises a select transistor provided between the first end of the magnetoresistive element and the first wire.

11. The magnetic memory according to claim 9, wherein, among the magnetic material layers of the second magnetic film, the magnetic material layer closest to the first nonmagnetic layer is a $(Co_{100-x}Fe_x)_{100-y}B_y$ ($x \geq 25$ atomic %, $0 \leq y \leq 30$ atomic %) layer.

12. The magnetic memory according to claim 9, wherein each of the nonmagnetic material layers is 10 angstroms or less in film thickness.

13. The magnetic memory according to claim 9, wherein the first magnetic film is one of a CoFePd film and a CoFePt film.

14. The magnetic memory according to claim 9, wherein
one of the first magnetic layer and the second magnetic layer is a fixed layer having a fixed magnetization, and
wherein the magnetoresistive element further comprises a third magnetic layer having a magnetization direction antiparallel to the magnetization direction of the fixed layer, the third magnetization layer formed on the opposite side of the fixed layer from the first nonmagnetic layer.

15. The magnetic memory according to claim 14, wherein
a second nonmagnetic layer is interposed between the fixed layer and the third magnetic layer, and
the fixed layer and the third magnetic layer are antiferromagnetically coupled to each other.

16. The magnetic memory according to claim 9,
wherein one of the first magnetic layer and the second magnetic layer is a fixed layer having a fixed magnetization,
wherein the magnetoresistive element further comprises a third magnetic layer having a magnetization direction antiparallel to the magnetization direction of the fixed layer, the third magnetization layer formed on the opposite side of the fixed layer from the first nonmagnetic layer, and
wherein the following relationship is satisfied:

$$M_{S2} \times t_2 < M_{S22} \times t_{22},$$

where $t_2$ and $M_{S2}$ represent a film thickness and a saturation magnetization of the fixed layer, and $t_{22}$ and $M_{S22}$ represent a film thickness and a saturation magnetization of the third magnetic layer.

17. The magnetic memory according to claim 9, wherein the first nonmagnetic layer is an oxide layer having a NaCl structure.

18. The magnetoresistive element according to claim 1, wherein
among the magnetic material layers of the second magnetic film, the magnetic material layer contacting the first nonmagnetic material layer includes a Co/Fe with a composition ratio differing from that of the magnetic material layer contacting the first magnetic film.

* * * * *